United States Patent [19]

Yamaguchi et al.

[11] Patent Number: 4,471,322
[45] Date of Patent: Sep. 11, 1984

[54] POWER AMPLIFIER

[75] Inventors: Hiroyasu Yamaguchi; Yasuhiro Kodera, both of Yokohama, Japan

[73] Assignee: Tokyo Shibaura Denki Kabushiki Kaisha, Kanagawa, Japan

[21] Appl. No.: 290,407

[22] Filed: Aug. 5, 1981

[30] Foreign Application Priority Data

Sep. 16, 1980 [JP] Japan .................................. 55-128338

[51] Int. Cl.³ .............................................. H03F 3/26
[52] U.S. Cl. ..................................... 330/267; 330/273; 330/298
[58] Field of Search ..................... 330/262, 263, 207 P, 330/298, 265, 267, 268, 270, 271, 273

[56] References Cited

U.S. PATENT DOCUMENTS

| | | | |
|---|---|---|---|
| 3,891,933 | 6/1975 | Suzuki et al. | 330/207 P |
| 3,914,703 | 10/1975 | Stauffer | 330/268 |
| 4,316,149 | 2/1982 | Yamaguchi | 330/268 |
| 4,330,755 | 5/1982 | Yamaguchi et al. | 330/271 |
| 4,355,341 | 10/1982 | Kaplan | 330/298 |

FOREIGN PATENT DOCUMENTS 2027307 2/1980 United Kingdom .

OTHER PUBLICATIONS

"Monolithic Operational Amplifier Design with Improved HF Behavior" by Johan H. Huijsing and Frans Tol, IEE Journal of Solid–State Circuits, vol. SC-11, No. 2, (Apr. 1976).

Primary Examiner—James B. Mullins
Assistant Examiner—G. Wan
Attorney, Agent, or Firm—Banner, Birch, McKie & Beckett

[57] ABSTRACT

A power amplifier is disclosed which reliably amplifies an input signal and decreases power consumption. A pre-driving circuit pre-drives a driving circuit of a power amplifying circuit in response to an input signal. The driving circuit drives an output circuit in the power amplifying circuit. A detecting circuit detects the level of the output of the driving circuit. The pre-driving circuit receives the output of the detecting circuit and supplies the pre-driving circuit with a pre-driving current varying in response to the output of the detecting circuit. Consequently, the pre-driving current can be designed to change in response to demand, i.e., the pre-driving current can be low when demand is low and increase as the occasion demands.

3 Claims, 3 Drawing Figures

POWER AMPLIFIER

BACKGROUND OF THE INVENTION

This invention relates to a power amplifier, particularly a power amplifier for use in various audio circuits.

In an audio output stage of an audio apparatus, such as used in a television receiver, a power amplifying circuit amplifies an audio signal so that the audio signal can drive a loudspeaker. Usually, from the viewpoint of power efficiency, the power amplifying circuit employs a class B power amplifying circuit which comprises a push-pull transistor output circuit and a driving circuit driving the output circuit. This type of power amplifying circuit normally is pre-driven by a pre-driving circuit in response to an audio input signal; the pre-driving circuit usually comprises a class A amplifying circuit. Furthermore, the pre-driving circuit supplies a pre-driving current to the driving circuit of the power amplifying circuit. In the prior art, the pre-driving circuit generates a constant pre-driving current corresponding to the maximum pre-driving current for the driving circuit irrespective of the level of the incoming audio signal. Accordingly, the pre-driving circuit wastefully consumes power.

SUMMARY OF THE INVENTION

Accordingly, an object of the present invention is to provide a power amplifier which reliably amplifies an input signal and decreases power consumption. Another object of the present invention is to provide a power amplifier including a circuit which prevents the power amplifier from being destroyed by excessive current.

According to the present invention, a pre-driving circuit pre-drives a driving circuit of a power amplifying circuit in response to an input signal. The driving circuit drives an output circuit in the same power amplifying circuit. A detecting circuit detects the level of an output of the driving circuit. The pre-driving circuit is responsive to the output of the detecting circuit to supply the pre-driving circuit with a pre-driving current varying in response to the output of the detecting circuit. As a result, the pre-driving current can be designed to change in response to demand, i.e., the current can be low when demand is low and increase as demand increases.

The objects and advantages of the present invention will become apparent to persons skilled in the art from a study of the following description and the accompanying drawings.

DESCRIPTION OF THE PREFERRED EMBODIMENT

Figure 1:
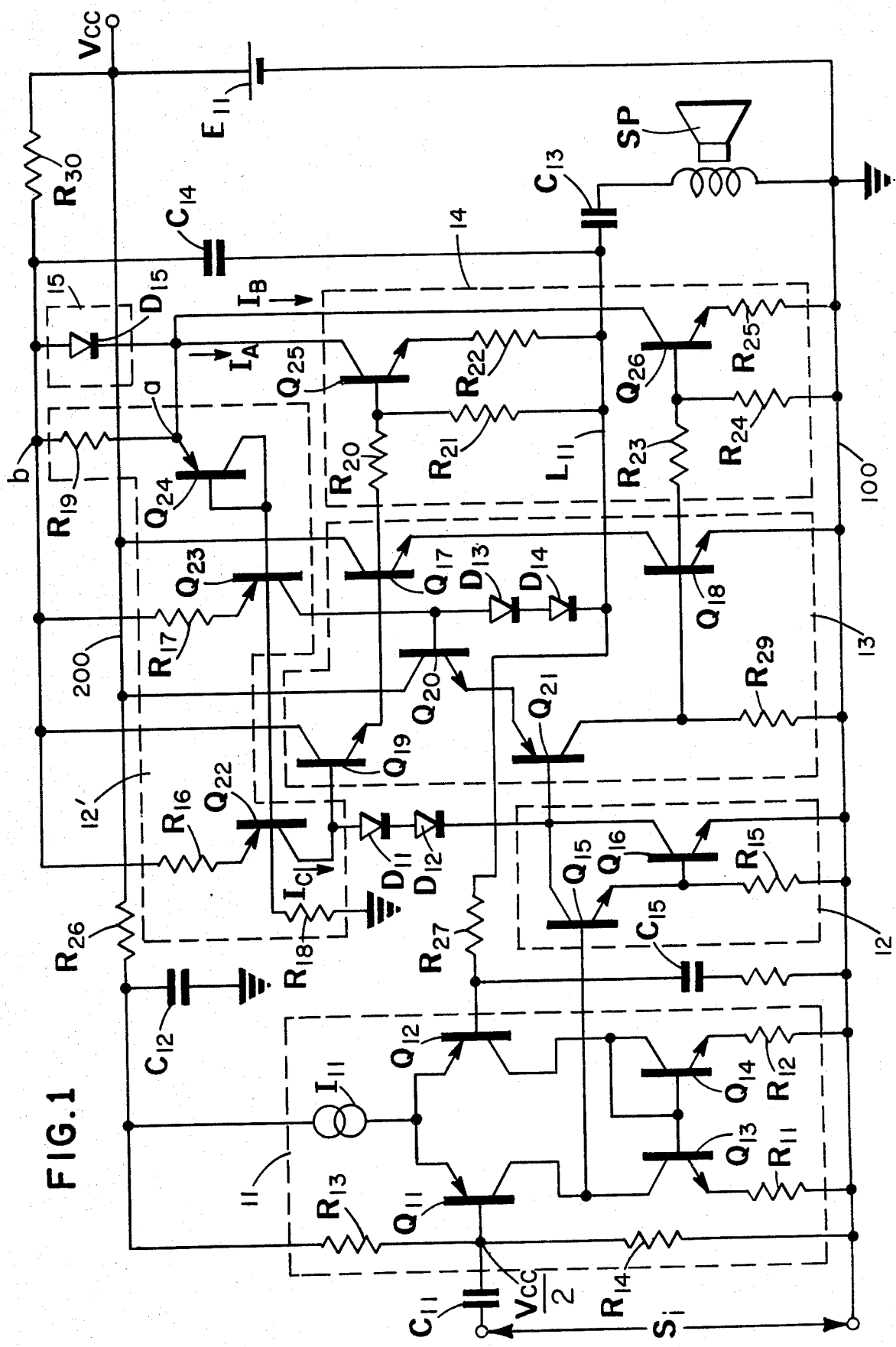
FIG. 1 is a circuit diagram of a power amplifier according to the present invention.

A quasi-complementary single ended push-pull (SEPP) power amplifier according to the present invention is shown in FIG. 1. An audio input signal $S_i$ is supplied to the base electrode of a transistor $Q_{11}$ via a condenser $C_{11}$. The base electrode of transistor $Q_{11}$ is connected to a ground line 100 through a resistor $R_{14}$, while ground line 100 is connected to the negative electrode of a reference voltage source $E_{11}$. The base electrode of transistor $Q_{11}$ is also connected to a power supply line 200 through resistors $R_{13}$ and $R_{26}$, while power supply line 200 is connected to the positive electrode of source $E_{11}$. The connection point of resistors $R_{13}$ and $R_{26}$ is grounded through a condenser $C_{12}$. The emitter electrode of transistor $Q_{11}$ is connected to the connection point of resistors $R_{13}$ and $R_{26}$ through a constant current source $I_{11}$. The constant current source $I_{11}$ is also connected to the emitter electrode of transistor $Q_{12}$. The collector electrode of transistor $Q_{11}$ is connected to the collector electrode of transistor $Q_{13}$, while the emitter electrode of transistor $Q_{13}$ is connected to ground line 100 through a resistor $R_{11}$. The collector electrode of transistor $Q_{12}$ is connected to the collector electrode of a transistor $Q_{14}$, while the base electrode of transistor $Q_{14}$ is connected to its collector electrode and the base electrode of transistor $Q_{13}$. The emitter electrode of transistor $Q_{14}$ is connected to ground line 100 through a resistor $R_{12}$. Transistors $Q_{11}$ and $Q_{12}$ constitute a differential amplifier 11 which is a primary stage of this power amplifier. Transistors $Q_{13}$ and $Q_{14}$ constitute a current mirror circuit.

An amplified audio signal is supplied from the collector electrode of transistor $Q_{11}$ to the base electrode of a transistor $Q_{15}$. The emitter electrode of transistor $Q_{15}$ is connected to the base electrode of a transistor $Q_{16}$ and to ground line 100 through a resistor $R_{15}$, while the collector electrode is connected to the collector electrode of transistor $Q_{16}$. The emitter electrode of transistor $Q_{16}$ is connected to ground line 100. Transistors $Q_{15}$ and $Q_{16}$ are arranged in a Darlington type connection as a class A amplifier and constitute one portion 12 of a pre-driving circuit.

The audio signal output voltage is supplied from the collector electrode of transistor $Q_{16}$ to the base electrode of a transistor $Q_{21}$ and to the base electrode of a transistor $Q_{19}$ through diodes $D_{11}$ and $D_{12}$. The collector electrode of transistor $Q_{19}$ is connected to power supply line 200 through a resistor $R_{30}$, while its emitter electrode is connected to the base electrode of a transistor $Q_{17}$. The collector electrode of transistor $Q_{21}$ is connected to ground line 100 through a resistor $R_{29}$ and to the base electrode of a transistor $Q_{18}$, while its emitter electrode is connected to the emitter electrode of a transistor $Q_{20}$. The base electrode of transistor $Q_{20}$ is connected to the emitter electrode of transistor $Q_{17}$ through diodes $D_{13}$ and $D_{14}$, while its collector electrode is connected to power supply line 200.

The collector electrode of transistor $Q_{17}$ is connected to power supply line 200, while its emitter electrode is connected to an ouput line $L_{11}$. The emitter electrode of transistor $Q_{18}$ is connected to ground line 100, while its collector electrode is connected to output line $L_{11}$. Output line $L_{11}$ is connected to a loudspeaker SP through a condenser $C_{13}$, and to power supply line 200 through a condenser $C_{14}$ and resistor $R_{30}$. Further, output line $L_{11}$ is connected to the base electrode of transistor $Q_{12}$ through a feedback resistor $R_{27}$. The base electrode of transistor $Q_{12}$ is also connected to ground line 100 through a condenser $C_{15}$ and a resistor $R_{28}$.

Transistors $Q_{17}$ and $Q_{21}$ constitute a power amplifying circuit 13 which is the last stage of this power amplifier. In power amplifying circuit 13, transistors $Q_{17}$ and $Q_{18}$ constitute output transistors which perform a push-pull operation, and transistors $Q_{19}$, $Q_{20}$ and $Q_{21}$ are the driving transistors for transistors $Q_{17}$ and $Q_{18}$.

The collector electrode of a transistor $Q_{22}$ is connected to the base electrode of transistor $Q_{19}$, while its emitter electrode is connected to power supply line 200 through a resistor $R_{16}$ and resistor $R_{30}$. The base electrode of transistor $Q_{22}$ is grounded through a resistor $R_{18}$. The collector electrode of a transistor $Q_{23}$ is connected to the base electrode of transistor $Q_{20}$, while its emitter electrode is connected to power supply line 200 through a resistor $R_{17}$ and resistor $R_{30}$; its base electrode is connected to the base electrode of transistor $Q_{22}$. The base and collector electrodes of a transistor $Q_{24}$ are connected to the base electrode of transistor $Q_{22}$, while its emitter electrode is connected to power supply line 200 through a resistor $R_{19}$ and resistor $R_{30}$. Transistors $Q_{22}$ to $Q_{24}$ constitute the other portion 12' of the pre-driving circuit which supplies a pre-driving current $I_C$ to transistors $Q_{19}$ to $Q_{21}$ in power amplifying circuit 13.

The base electrode of a transistor $Q_{25}$ is connected to the base electrode of transistor $Q_{17}$ through a resistor $R_{20}$ and to output line $L_{11}$ through a resistor $R_{21}$. The emitter electrode of transistor $Q_{25}$ is connected to output line $L_{11}$ through a resistor $R_{22}$, while its collector electrode is connected to the emitter electrode of transistor $Q_{24}$. The base electrode of a transistor $Q_{26}$ is connected to the base electrode of transistor $Q_{18}$ through a resistor $R_{23}$ and to ground line 100 through a resistor $R_{24}$. The emitter electrode of transistor $Q_{26}$ is connected to ground line 100 through a resistor $R_{25}$, while its collector electrode is connected to the emitter electrode of transistor $Q_{24}$. Transistors $Q_{25}$ and $Q_{26}$ constitute a detecting circuit 14 which detects the level of signals supplied to the base electrodes of transistors $Q_{17}$ and $Q_{18}$, and generates currents $I_A$ and $I_B$ in response to the detected signal level.

Currents $I_A$ and $I_B$ from detecting circuit 14 are supplied to the emitter electrode of transistor $Q_{24}$ in the other portion 12' of the driving circuit. As detailed below, transistors $Q_{22}$ and $Q_{23}$ supply transistors $Q_{19}$, $Q_{20}$ and $Q_{29}$ with the pre-driving current $I_C$, which increases in response to an increase in the audio signal supplied to transistors $Q_{17}$ and $Q_{18}$. To the contrary, decreases in the audio signal result in a decrease of the pre-driving current $I_C$. Thus, since the other portion 12' of the pre-driving circuit generates the pre-driving current $I_C$ in response to the level of the audio signal supplied to power amplifying circuit 13, the pre-driving current $I_C$ can be designed to be small to thereby largely reduce power consumption. On the contrary, in power amplifiers of the prior art, the pre-driving circuit generates a constant pre-driving current corresponding to the maximum pre-driving current required at the maximum level of the audio signal. Therefore, such prior art pre-driving circuits wastefully consume power.

A diode $D_{15}$ is connected in parallel with resistor $R_{19}$ in the other portion 12' of the pre-driving circuit. Diode $D_{15}$ constitutes a restricting circuit 15 which prevents the pre-driving current $I_C$ generated by transistors $Q_{22}$ and $Q_{23}$ from increasing over the predetermined value. Therefore, transistors $Q_{17}$ to $Q_{21}$ are not destroyed.

Figure 2:
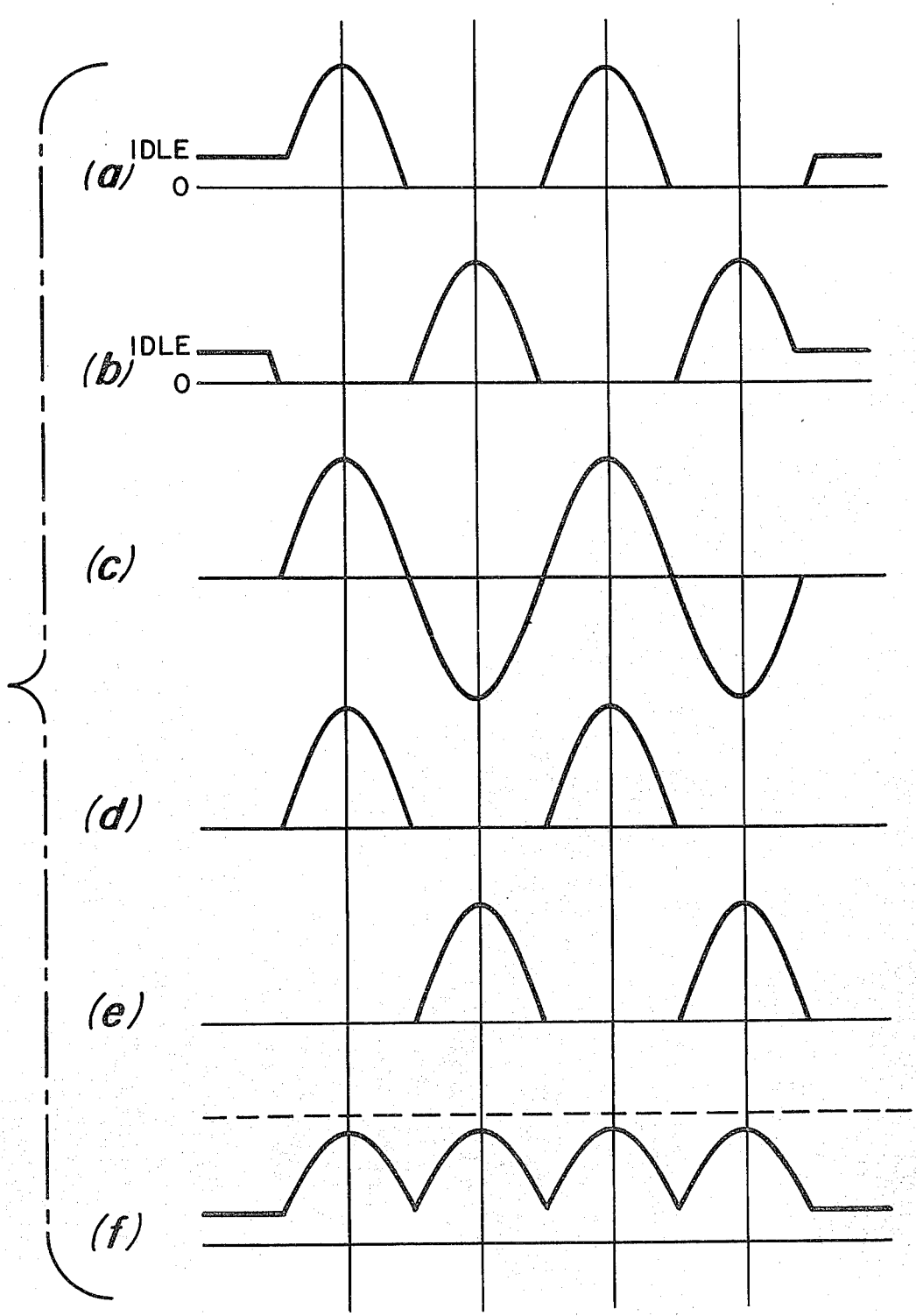
FIG. 2 is a waveform diagram illustrating waveform signals of various points of FIG. 1.

Next, the operation of the power amplifier is described with reference to the waveforms of FIG. 2. After the audio input signal is amplified by differential amplifier 11 and the one portion 12 of the pre-driving circuit, its voltage waveform is supplied to power amplifying circuit 13. During a positive half cycle of the audio signal, the pre-driving current $I_C$ from transistor $Q_{22}$ flows into the base electrode of transistor $Q_{19}$, and then transistor $Q_{19}$ conducts. Transistor $Q_{17}$ is driven by transistor $Q_{19}$ and a current, which is shown in FIG. 2(a), flows at the collector electrode of transistor $Q_{17}$. At this time, transistors $Q_{20}$, $Q_{21}$ and $Q_{18}$ are cut off. During a negative half cycle of the audio signal, transistors $Q_{20}$ and $Q_{21}$ conduct to drive transistors $Q_{18}$, having the collector current flow shown in FIG. 2b. At this time, the pre-driving current $I_C$ from transistor $Q_{22}$ flows into diodes $D_{11}$ and $D_{12}$, and transistors $Q_{19}$ and $Q_{17}$ are cut off. Thus, transistors $Q_{17}$ and $Q_{18}$ perform a push-pull operation to supply loudspeaker SP with an amplified audio output signal which has the waveform shown in FIG. 2(c).

In the current wave forms of FIGS. 2(a) and (b), the flat portion is the collector current of each of transistors $Q_{17}$, $Q_{18}$ (i.e., an idle current idle) which is required when the audio signal does not exist.

As shown in FIG. 2(d), the detected current $I_A$ flows at the collector electrode of transistor $Q_{25}$ of detecting circuit 14 in response to the potential between the base and emitter electrodes of transistor $Q_{17}$ (i.e., the positive level of the audio signal). When the potential between the base and emitter electrodes of transistor $Q_{17}$ increases, the detected current $I_A$ increases. When the potential between the base and emitter electrodes of transistor $Q_{18}$ decreases, the detected current $I_A$ decreases. As shown in FIG. 2(e), a detected current $I_B$ likewise flows at the collector electrode of transistor $Q_{26}$ in response to the potential between the base and emitter electrodes of transistor $Q_{18}$ (i.e., the negative level of the audio signal).

Both detected currents $I_A$ and $I_B$ also flow through resistor $R_{19}$ in the other portion 12' of pre-driving circuit. When detected currents $I_A$ and $I_B$ increase, the voltage drop across resistor $R_{19}$ increases, and the base potential of transistors $Q_{22}$ and $Q_{23}$ decreases. Therefore, the collector current of transistors $Q_{22}$ and $Q_{23}$ (i.e., the pre-driving current $I_C$) increases, as shown in FIG. 2(f). Consequently, the driving current supplied from transistors $Q_{19}$, $Q_{20}$ and $Q_{21}$ increases and the voltage between the base and emitter electrodes of transistors $Q_{17}$ and $Q_{18}$ increases. On the contrary, when the detected currents $I_A$ and $I_B$ decrease, the votage drop across resistor $R_{19}$ decreases, and the base potential of transistors $Q_{22}$ and $Q_{23}$ increases. Therefore, the collector current $I_C$ of transistors $Q_{22}$ and $Q_{23}$ decreases, as shown in FIG. 2(f). Consequently, the driving current supplied from transistors $Q_{19}$, $Q_{20}$ and $Q_{21}$ decreases and the voltage between the base and emitter electrodes of transistors $Q_{17}$ and $Q_{18}$ decreases. Thus, when the voltage between the base and emitter electrodes of transistors $Q_{17}$ and $Q_{18}$ is high, namely, the level of the audio signal is large, the pre-driving current $I_C$ from transistors $Q_{22}$ and $Q_{23}$ is large and the gain of transistors $Q_{17}$ and $Q_{18}$ is large. When the voltage between the base and emitter electrodes of transistors $Q_{17}$ and $Q_{18}$ is low, namely, the level of the audio signal is small or the audio signal does not exist, the pre-driving current $I_C$ from transistors $Q_{22}$ and $Q_{23}$ is small and the gain of transistors is small.

As a result, the pre-driving current $I_C$ changes in response to demand; this current need not be constant and large. Accordingly, the pre-driving circuits 12 and 12' can reduce the power consumption when the level of the audio signal is small or the audio signal does not exist. Further, the power amplifier can reliably amplify the audio input signal and supply it to loudspeaker SP. On the other hand, in the power amplifiers of the prior art, the pre-driving circuit must generate a constant pre-driving current shown by a broken line in FIG. 2(f). Accordingly, prior art pre-driving circuits wastefully consume power.

Next, the function of restricting circuit 15 is described in detail. When the voltage drop across resistor $R_{19}$ is larger than the forward voltage of diode $D_{15}$ in response to the increase of detected currents $I_A$ and $I_B$, diode $D_{15}$ conducts and the detected currents flow through resistor $R_{19}$ and diode $D_{15}$. The voltage drop across resistor $R_{19}$ is fixed at the forward voltage of diode $D_{15}$. Accordingly, the base potential of transistors $Q_{22}$ and $Q_{23}$ cannot drop under the predetermined value and the pre-driving current $I_C$ likewise cannot increase. As a result, transistors $Q_{17}$ to $Q_{21}$ are not destroyed. Restricting circuit 15 effectively functions when the level of the audio signal is very large and a load (i.e., loudspeaker SP) shorts.

Further, resistors $R_{22}$ and $R_{25}$, which are connected to the emitter electrodes of transistors $Q_{25}$ and $Q_{26}$ as well as restricting circuit 15, perform a restricting function. Resistors $R_{22}$ and $R_{25}$ provide positive feedback and prevent the extreme current from flowing into the base electrodes of transistors $Q_{25}$ and $Q_{26}$. As a result, the pre-driving current $I_C$ does not increase excessively, and the transistors $Q_{17}$ to $Q_{21}$ are not destroyed A modification of the above circuit is possible. Transistor $Q_{24}$ can be removed and two diodes can be connected in parallel with resistor $R_{19}$ in place of diode $D_{15}$. The circuit, as modified, would still operate as described above.

Figure 3:
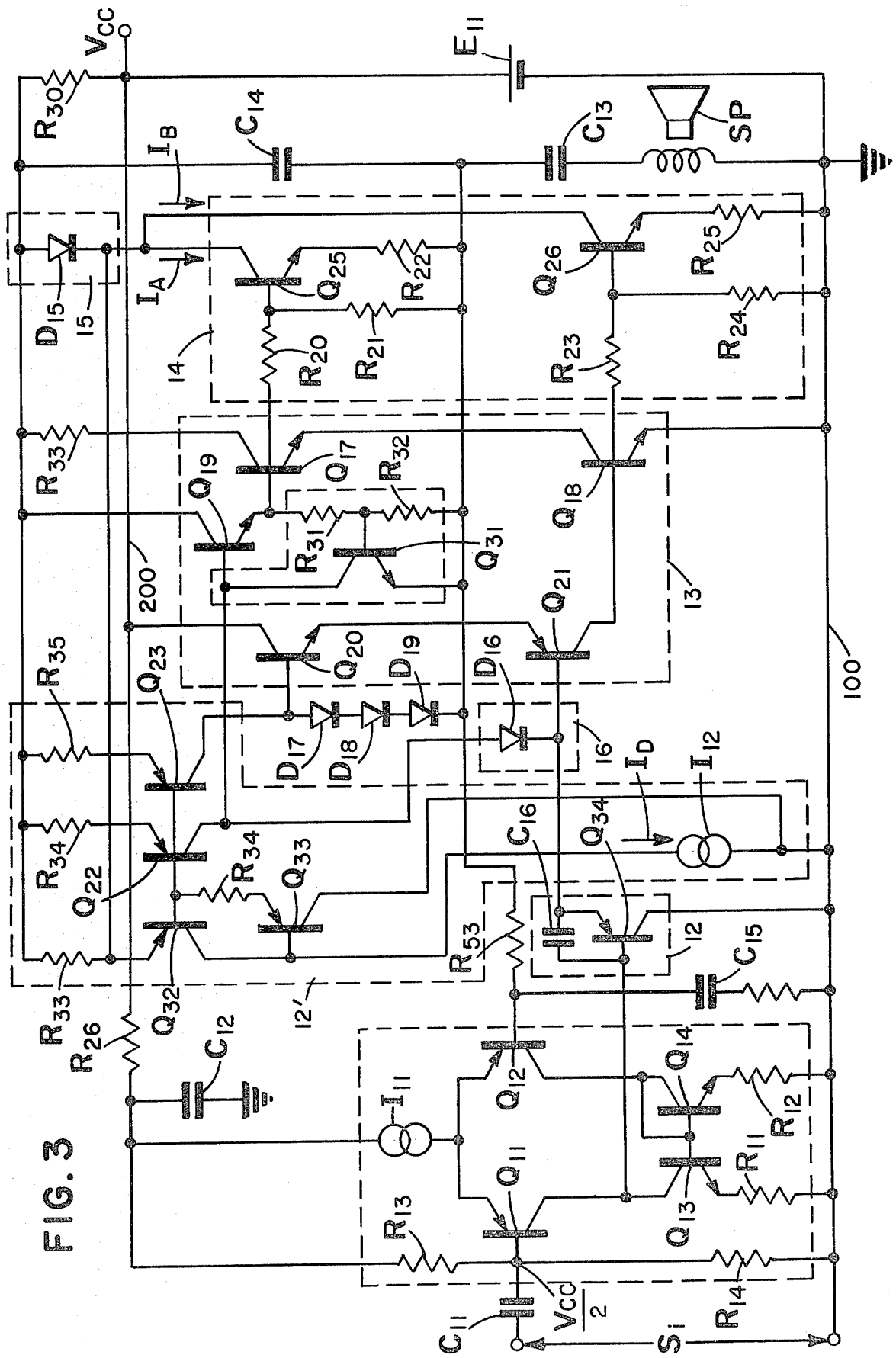
FIG. 3 is a circuit diagram of another embodiment of the present invention.

Another embodiment of the present invention is shown in FIG. 3. For the sake of simplicity, like reference numerals are used to designate like or equivalent portions for the circuit of FIG. 1, and the explanation of these portions is omitted. After an audio input signal Si is amplified by differential amplifier 11, which is equivalent to the differential amplifier 11 in FIG. 1, it is supplied to the base electrode of a transistor $Q_{34}$. The transistor $Q_{34}$ constitutes one portion 12 of a pre-driving circuit. Its collector electrode is connected to a ground line 100, while its emitter electrode is connected to the base electrode of a transistor $Q_{19}$ through a diode $D_{16}$ and to the base electrode of a transistor $Q_{21}$. Its emitter electrode is also connected to its base electrode through a condenser $C_{16}$.

The voltage waveform of the audio signal from transistor $Q_{34}$ is supplied to transistors $Q_{19}$, $Q_{20}$ and $Q_{21}$. Transistors $Q_{19}$, $Q_{20}$ and $Q_{21}$ drive output transistors $Q_{17}$ and $Q_{18}$. Transistors $Q_{17}$ to $Q_{21}$, like transistors $Q_{17}$ to $Q_{21}$ in FIG. 1, constitute a power amplifying circuit 13. Power amplifying circuit 13 has substantially the same constitution as power amplifying circuit 13 in FIG. 1 except that the base electrode of transistor $Q_{20}$ is connected to the emitter electrode of transistor $Q_{17}$ through diodes $D_{17}$, $D_{18}$ and $D_{19}$, and the collector electrode of transistor $Q_{17}$ is connected to a power supply line 200 through resistors $R_{30}$ and $R_{33}$.

A detecting circuit 14, which is connected to the base electrodes of transistors $Q_{17}$ and $Q_{18}$, has the same constitution and function as detecting circuit 14 in FIG. 1. The collector electrodes of transistors $Q_{25}$ and $Q_{26}$ of detecting circuit 14 are connected to the emitter electrode of a transistor $Q_{32}$.

The emitter electrode of transistor $Q_{32}$ is also connected to power supply line 200 through resistors $R_{33}$ and $R_{30}$. Its collector electrode is connected to ground line 100 through a constant current source $I_{12}$, while its base electrode is connected to the emitter electrode of a transistor $Q_{33}$ through a resistor $R_{34}$. The collector electrode of transistor $Q_{33}$ is connected to ground line 100, while its base electrode is connected to the collector electrode of transistor $Q_{32}$. The base electrodes of transistors $Q_{22}$ and $Q_{23}$ are connected to the base electrode of transistors $Q_{32}$. The emitter electrode of transistor $Q_{22}$ is connected to power supply line 200 through resistors $R_{34}$ and $R_{30}$, while its collector electrode is connected to the base electrode of transistor $Q_{19}$. The emitter electrode of transistor $Q_{23}$ is connected to power supply line 200 through resistors $R_{35}$ and $R_{30}$, while its collector electrode is connected to the base electrode of transistor $Q_{20}$. Transistors $Q_{22}$, $Q_{23}$ and $Q_{32}$ constitute the other portion 12' of the pre-driving circuit and supply a pre-driving current $I_C$ to power amplifying circuit 13.

A diode $D_{15}$ is connected in parallel with resistor $R_{33}$ and constitutes a restricting circuit 15. Further, a second restricting circuit 16 is employed as described below. The collector electrode of a transistor $Q_{31}$ is connected to the base electrode of transistor $Q_{19}$, while its emitter electrode is connected to the emitter electrode of transistor $Q_{17}$. The base electrode of transistor $Q_{31}$ is connected to the emitter electrode of transistor $Q_{19}$ through a resistor $R_{31}$ and to the emitter electrode of transistor $Q_{17}$ through a resistor $R_{32}$.

Next, the operation of the other portion 12' of the pre-driving circuit is described. Since most base currents of transistors $Q_{22}$, $Q_{23}$ and $Q_{32}$ flow through transistor $Q_{33}$, the collector current of transistor $Q_{32}$ is substantially constant and equal to the current value $I_D$ of constant current source $I_{12}$. Therefore, the voltage across the base and emitter electrodes of transistor $Q_{32}$ is substantially constant. Detected currents $I_A$ and $I_B$, which are supplied from detecting circuit 14, flow through resistor $R_{33}$. When the voltage drop across resistor $R_{33}$ increases in response to the increase of the detected currents $I_A$ and $I_B$, the base potential of transistor $Q_{32}$ decreases in proportion to the increase of voltage drop across resistor $R_{33}$. Accordingly, the base potential of each transistor $Q_{22}$ and $Q_{23}$ decreases and its collector current (i.e., the pre-driving current $I_C$) increases. On the contrary, in response to the decrease of the detected currents $I_A$ and $I_B$, the pre-driving current $I_C$ decreases.

As a result, the pre-driving current $I_C$ changes in response to demand and need not to be constant and large. Accordingly, this power amplifier has the same advantages as the embodiment shown in FIG. 1.

Restricting circuit 15 has the same function as restricting circuit 15 of the embodiment of FIG. 1. Further, the function of second restricting circuit 16 is as follows. When the voltage between the base and emitter electrodes of transistor $Q_{31}$ is larger than the predetermined value at the positive half cycle of the audio signal, transistor $Q_{31}$ conducts. Therefore, one portion of the pre-driving current $I_C$ from transistor $Q_{22}$ flows through transistor $Q_{31}$. As a result, the excessive current is prevented from flowing through transistors $Q_{19}$ and $Q_{17}$. Resistors $R_{20}$, $R_{21}$, $R_{31}$ and $R_{32}$ have the following relationship so that transistor $Q_{31}$ can begin to conduct before the transistor $Q_{25}$ conducts:

$$(R_b/R_a), > (R_d/R_c),$$

where Ra, Rb, Rc and Rd are the values of resistors $R_{20}$, $R_{21}$, $R_{31}$ and $R_{32}$, respectively. It is preferable that a circuit like second restricting circuit 16 is likewise employed for transistors $Q_{20}$ and $Q_{22}$ for the negative half cycle of the audio signal.

The power amplifiers shown in FIGS. 1 and 3 may be modified as mentioned below. Resistors $R_{21}$ and $R_{24}$ may be removed so that detecting circuit 14 operates more quickly. Further, the detecting currents $I_A$ and $I_B$, from which an AC component is removed, are supplied to the other portion 12' of the pre-driving circuit. Field-effect transistors also may be employed in the place of transistors $Q_{17}$, $Q_{18}$, $Q_{25}$, $Q_{26}$ and $Q_{31}$.

Although illustrative embodiments of the invention have been described in detail with reference to the accompanying drawings, it is to be understood that the invention is not limited to those precise embodiments and that various changes and modifications may be effected therein by one skilled in the art without departing from the scope or sprirt of the invention.

We claim:

1. A power amplifier having an input terminal for receiving an audio signal comprising:
    a power amplifier circuit including a driving circuit and an output circuit having push-pull transistors, said driving circuit having an output for driving said output circuit;
    detecting circuit means coupled to said power amplifier circuit for generating a detected current signal which increases in response to an increase in the level of the output of said driving circuit and decreases in response to a decrease in the level of the output of said driving circuit; and
    pre-driving means coupled to said input terminal of said power amplifier and said power amplifier circuit for receiving the detected current signal of said detecting circuit means and supplying said driving circuit with a pre-driving current which increases in response to an increase in said detected current signal and decreases in response to a decrease in said detected current signal.

2. The power amplifier of claim 1 comprising restricting circuit means for restricting the operation of said pre-driving circuit means so that the pre-driving current from said pre-driving circuit means does not increase over a predetermined value.

3. The power amplifier of claims 1 or 2 comprising second restricting circuit means for restricting the output of said driving circuit so that the output of said driving circuit does not increase over a predetermined value.

* * * * *